(12) United States Patent
Goela et al.

(10) Patent No.: US 7,018,947 B2
(45) Date of Patent: *Mar. 28, 2006

(54) LOW RESISTIVITY SILICON CARBIDE

(75) Inventors: Jitendra S. Goela, Andover, MA (US); Michael A. Pickering, Dracut, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/790,442

(22) Filed: Feb. 21, 2001

(65) Prior Publication Data

US 2002/0004444 A1   Jan. 10, 2002

Related U.S. Application Data

(60) Provisional application No. 60/184,766, filed on Feb. 24, 2000.

(51) Int. Cl.
  *C04B 35/569* (2006.01)
  *H01B 1/04* (2006.01)

(52) U.S. Cl. .......................... 501/88; 501/92; 252/516
(58) Field of Classification Search .................. 501/88, 501/92, 90; 423/345, 346; 252/516
  See application file for complete search history.

(56) References Cited

U.S. PATENT DOCUMENTS

| | | | |
|---|---|---|---|
| 4,772,498 A | | 9/1988 | Bertin et al. |
| 5,071,596 A | | 12/1991 | Goela et al. |
| 5,093,039 A | * | 3/1992 | Kijima et al. ................ 252/516 |
| 5,332,601 A | * | 7/1994 | Varacalle, Jr. et al. ...... 427/452 |
| 5,354,580 A | | 10/1994 | Goela et al. |
| 5,374,412 A | | 12/1994 | Pickering et al. |
| 5,604,151 A | * | 2/1997 | Goela et al. ................. 437/100 |
| 5,612,132 A | * | 3/1997 | Goela et al. ................. 428/332 |
| 5,683,028 A | | 11/1997 | Goela et al. |
| 5,993,770 A | * | 11/1999 | Kuroyanagi et al. ......... 423/345 |
| 6,001,756 A | * | 12/1999 | Takahashi et al. ............. 501/90 |
| 6,090,733 A | * | 7/2000 | Otsuki et al. .................. 501/90 |
| 6,187,704 B1 | * | 2/2001 | Takahashi et al. ............ 501/90 |
| 6,214,755 B1 | * | 4/2001 | Otsuki et al. .................. 501/90 |
| 2002/0037801 A1 | * | 3/2002 | Sugihara et al. .............. 501/88 |

FOREIGN PATENT DOCUMENTS

| | | |
|---|---|---|
| EP | 0 582 444 A1 | 2/1994 |
| EP | 1178132 * | 6/2002 |
| JP | 2001-220237 * | 8/2001 |

OTHER PUBLICATIONS

Matsunami et al., "Step-controlled epitaxy of SiC: high-quality homoepitaxial growth", Diamond and Related Materials 7 (1998) 342-347.

Northern Lights Optics, optical design got amateur telescope makers, http://www.minerals.sk.ca/atm_carbide.html; Aug. 16, 2004.

Rost et al.; "Growth related distribution of secondary phase inclusions in 6H-SiC single crystals"; Journal of Crystal Growth 225 (2001) pp. 317-321.

Wellman et al.; "Impact of source material on silicon carbide vapor transport growth process"; Journal of Crystal Growth 225 (2001); pp. 312-316.

Nima Ghalichechian; "Silicon Carbide Overview of Physical Properties and Thin Film Deposition"; ENEE793, Solid State Electronics; University of Maryland; Fall 2002; pp. 1-22.

* cited by examiner

*Primary Examiner*—Karl Group
(74) *Attorney, Agent, or Firm*—John J. Piskorski

(57) ABSTRACT

Free standing articles of chemical vapor deposited silicon carbide with electrical resistivities of less than 0.9 ohm-cm are provided without substantially degrading its thermal conductivity or other properties.

18 Claims, 1 Drawing Sheet

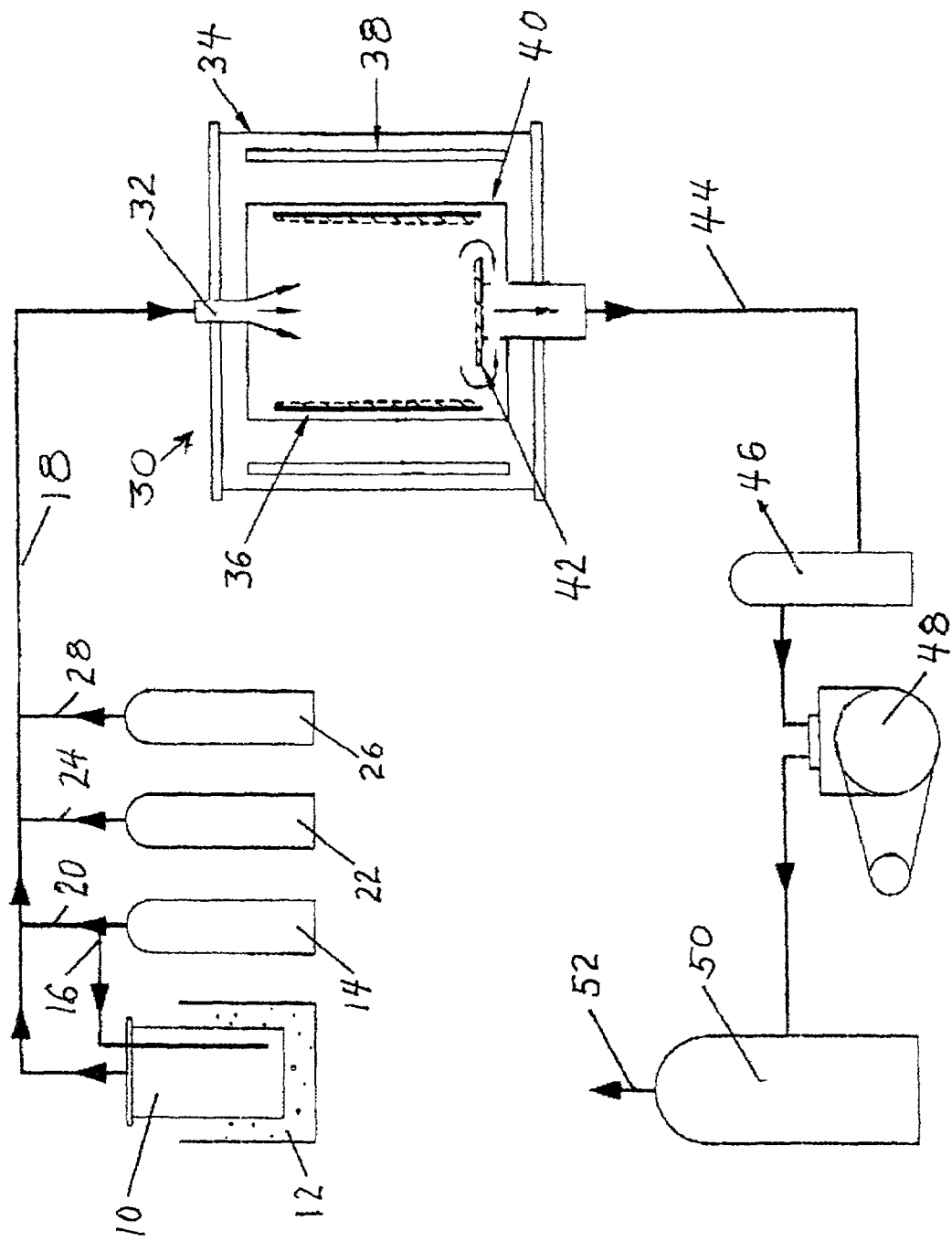

LOW RESISTIVITY SILICON CARBIDE

This application claims the benefit of U.S. Provisional Application No. 60/184,766 filed in Feb. 24, 2000.

BACKGROUND OF THE INVENTION

1. Field of the Invention

Silicon carbide's unique combination of properties make it a particularly suitable material for a variety of applications in the semiconductor, optical, electronic and chemical processing fields. Some potential applications, however, have been limited by the intrinsic high electrical resistivity of silicon carbide. This invention is directed to chemical vapor deposited low resistivity silicon carbide (CVD-LRSiC) having an electrical resistivity of less than 0.9 ohm-cm., and, especially, to free standing articles made of such CVD-LRSiC. Such articles are particularly useful in high temperature furnaces, such as semiconductor processing furnaces and plasma etching apparatus.

2. Background of the Invention

Silicon carbide, particularly silicon carbide produced by chemical vapor deposition (CVD-SiC), has unique properties which make it a material of choice in many high temperature applications, several of which are reviewed in U.S. Pat. No. 5,683,028. Pure CVD-SiC has relatively high electrical resistivity. While this is a desirable characteristic for certain applications, it is a limitation restricting its use in other applications. Certain components, such as the plasma screen, focus ring and edge ring used in plasma etching chambers need to be electrically conductive as well as possess high temperature stability. While the high temperature properties of CVD-SiC have made it a material of choice for use in such chambers, its high resistivity has limited its use in fabricating those components which require a greater degree of electrical conductivity.

The high electrical resistivity of CVD-SiC has further restricted its use in applications which are subject to the build-up of static electricity. The need to ground components used in such applications requires that they possess greater electrical conductivity than is generally found in CVD-SiC. A low resistivity silicon carbide would provide a unique and useful combination of high temperature properties with suitable electrical conductivity properties for use in applications where grounding is required.

Moreover, the combination of relatively low electrical resistivity with the high temperature properties of CVD-SiC, suggest the suitability of such CVD-SiC for fabrication into a variety of high temperature electrical components such as electrodes, heating elements, etc.

The chemical vapor deposition process for producing free standing silicon carbide articles involves reacting vaporized or gaseous chemical precursor in the vicinity of a substrate to result in silicon carbide depositing on the substrate. The deposition reaction is continued until the deposit reaches the desired thickness. The deposit is then separated from the substrate as a free-standing article which may or may not be further processed by shaping, machining, polishing, etc. to provide a final silicon carbide article.

In a typical chemical vapor deposition silicon carbide production run, a silicon carbide precursor gas, such as a mixture of methyltrichlorosilane (MTS), hydrogen and argon, is fed to a deposition chamber where it is heated to a temperature at which it reacts producing silicon carbide. The silicon carbide deposits as a layer, or shell, on a solid mandrel provided in the deposition chamber. After the desired thickness of silicon carbide is deposited on the mandrel, the coated mandrel is removed from the deposition chamber and the deposit separated therefrom. Monolithic silicon carbide plates and cylinders have been produced by applying such chemical vapor deposition (CVD) techniques with suitably shaped substrate or mandrel forms. Several CVD-SiC deposition systems are described and illustrated in U.S. Pat. Nos. 5,071,596; 5,354,580; and 5,374,412, which are incorporated herein by reference.

SUMMARY OF THE INVENTION

This invention provides free-standing articles of chemical vapor deposited silicon carbide having an electrical resistivity of 0.9 ohm-cm. or less. Chemical vapor deposited silicon carbide is generally very dense and free of voids, having a density of at least 3.0 g/cc, and preferably having a density of at least 3.15 g/cc (which corresponds to 98% of theoretical density) or greater. The lower resistivity of the inventive articles is principally attributable to providing a controlled amount of nitrogen throughout the silicon carbide as it is deposited. We have found that the electrical resistivity of CVD-SiC is reduced to 0.9 ohm-cm. or less when the CVD-SiC contains at least $6.3 \times 10^{18}$ atoms of nitrogen per cubic centimeter. The nitrogen is incorporated in the deposit by providing a controlled amount of nitrogen with the precursor gas in the gaseous mixture which is fed to the reaction zone adjacent the substrate. As the silicon carbide precursor reacts to form the silicon carbide deposit, nitrogen from the gaseous mixture is incorporated in the deposit.

The electrical resistivity of relatively pure silicon carbide is in excess of 5000 ohm-cm. Trace amounts of impurities increase the carrier concentration in the material, resulting in lowered electrical resistivity. While the resistivity of CVD-SiC could theoretically be lowered to a desired level by the introduction of a sufficient amount of impurities, the resulting elevated levels of impurities would adversely affect other properties of the material, such as its thermal conductivity and/or its high temperature stability. The inventive articles are relatively free of impurities, containing less than 10 ppmw, preferably no more than approximately 5 ppmw, of impurity trace elements as determined by gas discharge mass spectroscopy. The inventive material is further characterized by thermal conductivity of at least 195 Watts/meter° Kelvin (W/mK) and flexural strength of at least 390 MPa.

BRIEF DESCRIPTION OF THE DRAWINGS

The FIGURE is a schematic illustration of a chemical vapor deposition system for producing the inventive articles of CVD low resistivity silicon carbide.

DETAILED DESCRIPTION OF THE INVENTION

The electrical resistivity of silicon carbide produced by chemical vapor deposition (CVD-SiC) is strongly influenced by the concentration of trace element impurities in the deposit. Relatively pure CVD-SiC has a resistivity in excess of 5000 ohm-cm. Increasing concentrations of trace element impurities cause a rapid decrease of its electrical resistivity. While the controlled addition of elements such as boron or phosphorous might be adapted to provide low resistivity silicon carbide, it is believed that such additions are susceptible to competing reactions which complicate their incorporation in the deposit and cause deterioration of other properties of the CVD-SiC product, such as its thermal conductivity and high temperature stability.

We have discovered that the controlled incorporation of nitrogen in the deposit as it is formed permits the electrical resistivity of the product CVD-SiC to be controlled at 0.9 ohm-cm or lower, with minimal degradation of its other properties. The CVD-SiC also may be characterized by a thermal conductivity of at least 195 W/mK, and may be further characterized by a thermal conductivity of at least 250 W/mK.

The silicon carbide precursor is selected from materials which can be reacted to form silicon carbide. Such materials typically include a component, such as a silane or a chlorosilane, which can react to form the silicon moiety, and a component, such as a hydrocarbon, which can react to form the carbon moiety. The component contributing the silicon moiety can be different from, or can be the same as, the component contributing the carbon moiety. Hydrocarbon substituted silanes are preferred silicon carbide precursors because they contain both the silicon and carbon moieties in a single compound. The precursor(s) can be a compound which dissociates at the reaction conditions forming one or both of the silicon carbide moieties, or the precursors can be two or more compounds which react to provide one or both of the moieties. While the precursor(s) needs to be in the gas phase when reacted in the vicinity of the substrate, it is not necessary that the precursor's boiling point be less than ambient temperature. An inert, non-reactive gas, such as argon, helium or another noble gas, may be used as a carrier for a normally liquid (i.e. liquid at normal STP) precursor. Methyltrichlorosilane (MTS) is a preferred precursor, especially when used with hydrogen ($H_2$), which scavenges the chlorine released when MTS dissociates. Since MTS provides both silicon and carbon in a stoichiometric (1:1) ratio, no other source of the Si or C moieties is required. Argon is usually used as an inert, non-reactive, carrier gas for MTS (which is a liquid at room temperature). The argon also acts as a diluent whose flow rate can be varied to optimize the reaction and assure removal of byproducts from the reaction/deposition zone.

A chemical vapor deposition (CVD) system for producing silicon carbide articles according to the present invention is illustrated in the figure. Methyltrichlorosilane (MTS) is provided in a sealed container 10 located in a constant temperature bath 12. Argon from gas cylinder 14 is provided as a carrier gas for the MTS through line 16. The argon with entrained MTS passes from the sealed container 10 to feed line 18 where it is mixed with additional argon fed through line 20, hydrogen ($H_2$) provided from gas cylinder 22 through line 24, and nitrogen ($N_2$) provided from gas cylinder 26 through line 28. Each of the lines 16, 20, 24 and 28 include flow control regulators (not shown). The mixed precursor gases are fed to the deposition furnace 30 through an injector 32. The deposition furnace 30 comprises a water cooled stainless steel housing 34 enclosing a graphite mandrel 36, graphite heating elements 38, and a graphite isolation tube 40. The graphite mandrel 36 is arranged to enclose the central portion of the chamber. Such an arrangement can result from using a hollow cylindrical, or tubular mandrel, or by arranging a series of flat graphite plates in the form of an open-ended hollow box enclosing the central portion of the chamber. The mixed precursor gases are directed to sweep over the interior surface of the heated graphite mandrels causing dissociation of the MTS and the deposit of silicon carbide on the interior surface of the mandrel. The exhaust gases resulting from the dissociation reaction are withdrawn from the housing 34 after passing around baffle 42 and into exhaust line 44. The exhaust gases are directed through filter 46 wherein entrained solids are removed, and then pass through vacuum pump 48 which controls the reduced pressure in the deposition furnace. The gases then pass through gas scrubber 50 before exhausting to the atmosphere through vent 52.

The substrate may be any material which is solid at the reaction conditions. The substrate may be shaped to provide a flat surface to produce a flat article. It may be shaped as a cylinder to produce a cylindrical or tubular article. Graphite is a preferred material for the mandrel when it is to be used to form near net shape deposits. The deposit can be separated from a graphite mandrel by controlled oxidation (controlled combustion) of the graphite substrate. When an article having a principal surface with stringent dimensional tolerances is to be produced, such as a lens, the substrate or mandrel may be shaped as a negative of the desired principal surface.

The deposit after it is separated from the mandrel is a free-standing low-resistivity CVD-Sic article which can be sold as such, or can be further processed by shaping, machining, polishing, etc. to provide a more finished article.

EXAMPLE 1

Four separate triangular graphite mandrel boxes were loaded in a stainless steel water-cooled deposition furnace and silicon carbide was then deposited on the four mandrels simultaneously. The furnace pressure was adjusted to, and then maintained at, 200 torr. The mandrels were heated to, and then maintained at, 1350° C. by resistance heaters in the furnace. Reagents were fed through jets at the top of the furnace. The reagents fed to each mandrel box are listed in Table 1:

TABLE 1

| Reagent | Box 1 | Box 2 | Box 3 | Box 4 |
| --- | --- | --- | --- | --- |
| $H_2$, slpm | 40 | 40 | 40 | 40 |
| MTS, slpm | 6.6 | 6.6 | 6.6 | 6.6 |
| Ar, slpm | 54 | 44 | 34 | 22 |
| $N_2$, slpm | 0 | 10 | 20 | 32 |

The silicon carbide deposition was terminated after 50 hours. Flat plate articles were recovered by separating the deposits from the mandrels. Samples were recovered from the top and bottom of a portion of a plate taken from each of the mandrel boxes. The samples were analyzed for nitrogen content by scanning ion mass spectroscopy. The samples were analyzed for trace element impurities by gas discharge mass spectroscopy (GDMS). Analyses by GDMS is capable of detecting most solid elements and chlorine in amounts of 0.05 ppmw, and many of the solid elements in amounts as small as 0.005 ppmw, however it is not suitable for analyzing tantalum, fluorine, nitrogen or oxygen, as these may be contributed from extraneous sources during the analysis procedure. All references to trace element content or concentration throughout this application are to be understood to be trace element content as detected by GDMS. The samples were further characterized (a) for electrical resistivity with a four point resistivity probe; (b) for thermal conductivity by a laser flash technique; and (c) for flexural strength by a four point bend test. The results are reported in Table 2.

The effect of nitrogen depletion in the gaseous reagent is evident from a comparison of the lower resistivity of samples taken from the bottom of each deposition box with the higher resistivity of samples taken from the top-of the same box. The reagent is fed to the chamber as a jet and, due to its momentum, first impinges near the bottom of the box, and then recirculates, moving upward along the mandrel wall. At the more dilute $N_2$ concentrations (for instance, 10% $N_2$), the reagent becomes somewhat depleted as it reacts moving up the mandrel wall and has a lesser effect on the deposit's resistivity at the top of the mandrel than it did at the bottom. Since very little $N_2$ is actually incorporated in the deposit, the depletion phenomena becomes less significant as the concentration of $N_2$ in the reagent is increased, and the variation in resistivity from location to location along the mandrel is seen to decrease.

TABLE 2

| Box No. | $N_2$ Conc. Gas Phase % | N Conc. Solid Phase Atoms/cc | Resistivity Ohm-cm | Thermal Conductivity W/mK | Flexural Strength MPa | Purity ppmw |
|---|---|---|---|---|---|---|
| 1 top | 0 | $6.5 \times 10^{17}$ | 66.8 | 343 | 429 ± 51 | <5 |
| 1 botm. | 0 | $2.1 \times 10^{17}$ | 10.1 | 345 | 419 ± 52 | <5 |
| 2 top | 10 | $2.5 \times 10^{18}$ | 8.7 | 231 | 448 ± 48 | <5 |
| 2 botm. | 10 | $3.4 \times 10^{18}$ | 2.9 | 330 | 435 ± 52 | <5 |
| 3 top | 20 | $8.6 \times 10^{18}$ | 1.62 | 298 | 467 ± 60 | <5 |
| 3 botm. | 20 | $6.6 \times 10^{18}$ | 0.9 | 199 | 474 ± 50 | <5 |
| 4 top | 32 | $1.5 \times 10^{19}$ | 0.29 | 325 | 396 ± 73 | <5 |
| 4 botm. | 32 | $1.4 \times 10^{19}$ | 0.25 | 291 | 469 ± 54 | <5 |

The results establish a correlation between the resistivity of the silicon carbide deposit and the concentration of $N_2$ in both the reagent mixture and the solid deposit. When the concentration of $N_2$ is greater than $6.3 \times 10^{18}$ in the solid phase, the resistivity of the deposit is about 0.9 ohm-cm or less. Likewise, when the concentration of $N_2$ in the reagent gas phase is 20% or greater, the resistivity of the silicon carbide deposit is about 0.9 ohm-cm or less. The samples contained less than 5 ppmw of any detected trace impurities (trace amounts of Al, B, Cl, Fe, Ni, S, and V were detected). The lack of any significant content of detected trace impurities in the deposit is consistent with the reduction in resistivity being attributable to the increased nitrogen content, and not to an elevated impurity content.

EXAMPLE 2

Four graphite triangular mandrel boxes were arranged in a deposition furnace and silicon carbide deposited simultaneously under substantially identical process conditions in each of the boxes. The furnace pressure and temperature were the same as in Example 1, i.e. 200 Torr and 1350° C. The flow rate of reagents in each of the boxes was:

| | |
|---|---|
| MTS | 6.6 slpm |
| $H_2$ | 40 slpm |
| Ar | 22 slpm |
| $N_2$ | 20 slpm |

The total reagent gas flow was 88.6 slpm and the concentration of $N_2$ in the reagent gas was 22.6%. The deposition continued for 80 hours, following which the mandrels were removed from the furnace. The deposits were separated from the mandrels as three free-standing flat plate articles.

Scanning ion mass spectroscopy analyses of these plates indicated nitrogen contents of between $6.3 \times 10^{18}$ and $22 \times 10^{18}$ atoms N per cubic centimeter.

The resistivity of twenty samples taken from the flat plates (five from the plates produced in each of the boxes) was measured by the four-point probe method. All of the samples exhibited resistivity values below 0.9 ohm-cm. The resistivity values ranged from 0.1 to 0.88 ohm-cm with an average value of 0.52 ohm-cm. The thermal conductivity of four samples ranged between 260 and 329 W/mK and averaged 282 W/mK. The chemical purity of one sample measured less than 1.6 ppmw of detectable impurities by GDMS. The thermal conductivity and chemical purity values are typical of CVD-SiC.

Comparison of the physical properties of the deposits produced in both examples demonstrate that $N_2$ values of up to 32% in the reagent mix do not significantly affect the physical properties, other than the resistivity, of the deposited silicon carbide.

Various preferred embodiments of the inventive articles have been described. Modifications obvious to one of ordinary skill in the art may be made within the scope of the invention. The scope of the invention should be apparent from the following claims.

We claim:

1. A free standing article comprising chemical vapor deposited, low-resistivity silicon carbide having a nitrogen concentration of at least $6.3 \times 10^{18}$ atoms N per cubic centimeter and an electrical resistivity of less than 0.9 ohm-cm.

2. The free standing article of claim 1 further characterized by having a thermal conductivity of at least 195 W/mK.

3. The free standing article of claim 1 further characterized by having a thermal conductivity of at least 195 W/mK.

4. The free standing article of claim 1 further characterized by containing less than 10 ppmw of trace elements.

5. The free standing article of claim 4 further characterized by containing less than 5 ppmw of trace elements.

6. The free standing article of claim 1 further characterized by a density of at least 3.0 g/cc.

7. The free standing article of claim 1 further characterized by a flexural strength of at least 390 MPa.

8. The free standing article of claim 1 further characterized by having a thermal conductivity of at least 250 W/mK.

9. The free standing article of claim 1 further characterized by containing less than 10 ppmw of trace elements.

10. The free standing article of claim 9 further characterized by containing less than 5 ppmw of trace elements.

11. Tho free standing article of claim 1 farther characterized by a density of at least 3.0 g/cc.

12. The free standing article of claim 1 having a nitrogen concentration of at least $1.0 \times 10^{19}$ atoms N per cubic centimeter.

13. The free standing article of claim 1 having an electrical resistivity of no more than 0.5 ohm-cm.

14. The free standing article of claim 1 further characterized by a flexural strength of at least 390 MPa.

15. The free standing article of claim 1 further characterized by having a thermal conductivity of at least 250 W/mK.

16. A free standing article comprising chemical vapor deposited, low-resistivity silicon carbide having a nitrogen concentration of at least $6.3 \times 10^{18}$ atoms N per cubic centimeter and an electrical resistivity of less than 0.9 ohm-cm and a flexural strength of at least 390 MPa.

17. A free standing article comprising chemical vapor deposited, low-resistivity silicon carbide having a nitrogen concentration of at least $6.3 \times 10^{18}$ atoms N per cubic centimeter and an electrical resistivity of less than 0.9 ohm-cm and a thermal conductivity of between 260 W/mK and 329 W/mK.

18. A free standing article of claim 17 wherein the average thermal conductivity is 282 W/mK.

* * * * *